United States Patent
Lin et al.

(10) Patent No.: US 7,651,909 B2
(45) Date of Patent: Jan. 26, 2010

(54) METHOD FOR FABRICATING METAL-INSULATOR-METAL CAPACITOR

(75) Inventors: Ping-Wei Lin, Hsinchu (TW); Chin-Chia Wu, Yuanlin Township, Changhua County (TW); Chao-Sheng Chiang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 174 days.

(21) Appl. No.: 11/377,160

(22) Filed: Mar. 15, 2006

(65) Prior Publication Data

US 2007/0218626 A1    Sep. 20, 2007

(51) Int. Cl.
*H01L 21/8242* (2006.01)
(52) U.S. Cl. .................. 438/244; 257/E21.396; 257/296
(58) Field of Classification Search .............. 438/250, 438/954, 244; 257/E21.396
See application file for complete search history.

(56) References Cited

U.S. PATENT DOCUMENTS

| | | | |
|---|---|---|---|
| 6,177,305 B1 * | 1/2001 | Hornback et al. | 438/240 |
| 6,242,338 B1 * | 6/2001 | Liu et al. | 438/622 |
| 6,319,767 B1 * | 11/2001 | Cha et al. | 438/250 |
| 6,459,562 B1 * | 10/2002 | KarRoy et al. | 361/312 |
| 2001/0050390 A1 * | 12/2001 | Kawai et al. | 257/301 |
| 2005/0227432 A1 * | 10/2005 | Choi et al. | 438/244 |

FOREIGN PATENT DOCUMENTS

| CN | 1722379 | | 1/2006 |
|---|---|---|---|
| JP | 2002-43529 | * | 2/2002 |

* cited by examiner

*Primary Examiner*—Brook Kebede
*Assistant Examiner*—Tony Tran
(74) *Attorney, Agent, or Firm*—J.C. Patents (57) ABSTRACT

A method for fabricating a metal-insulator-metal capacitor is described. A first metal layer is formed on a substrate. A plasma treatment is performed on the surface of the first metal layer. Then, a first oxide layer, a nitride layer and a second oxide layer are formed in sequence over the first metal layer. Thereafter, a second metal layer is formed on the second oxide layer. The second metal layer, the second oxide layer, the nitride layer, the first oxide layer and the first metal layer are defined to form the metal-insulator-metal capacitor.

14 Claims, 6 Drawing Sheets

METHOD FOR FABRICATING METAL-INSULATOR-METAL CAPACITOR

BACKGROUND OF THE INVENTION

1. Field of the Invention

The present invention relates to a method for fabricating a capacitor. More particularly, the present invention relates to a method for fabricating a metal-insulator-metal capacitor.

2. Description of the Related Art

With great advances in technologies, semiconductor devices have found increasing number of applications. A large number of semiconductor devices each having a different function is used inside computers, communication equipment and consumer electronic products. Capacitor is one of the most basic and important semiconductor devices that has a number of functions including the de-coupling of noise and the storage of electric charges. Among the various types of capacitors, the metal-insulator-metal (MIM) capacitor plays an important role in circuits, particularly in mixed circuits of signal devices and logic devices.

The conventional method of fabricating a metal-insulator-metal capacitor includes the following steps. First, a metal layer is formed on a substrate to serve as the bottom electrode of the capacitor. Then, an oxide/nitride/oxide (ONO) composite layer is formed over the metal layer to serve as a dielectric layer for the capacitor. Thereafter, another metal layer is formed over the ONO composite layer to serve as the top electrode of the capacitor. Finally, the two metal layers and the ONO layer are defined to form the metal-insulator-metal (MIM) capacitor.

It should be noted that the permissible size of the capacitor continues to shrink with the development and increasing integration of the integrated circuits (ICs). Therefore, for an electronic product that incorporates a capacitor, the capacitor may have insufficient capacitance per unit area for proper functioning. To resolve this problem, the most common method is to reduce the thickness of the dielectric layer of the capacitor so that the capacitance per unit area of the capacitor is increased.

However, due to the unevenness of the metal layer that serves as the bottom electrode, the foregoing method of reducing the thickness of the dielectric layer above the bottom electrode may lead to lowering of the breakdown voltage of the capacitor. In some cases, even the reliability of the capacitor may be seriously compromised.

SUMMARY OF THE INVENTION

Accordingly, at least one objective of the present invention is to provide a method for fabricating a metal-insulator-metal (MIM) capacitor capable of increasing the breakdown voltage and the reliability of the MIM capacitor.

At least another objective of the present invention is to provide an alternative method for fabricating a metal-insulator-metal (MIM) capacitor equally capable of increasing the breakdown voltage and the reliability of the MIM capacitor.

To achieve these and other advantages and in accordance with the purpose of the invention, as embodied and broadly described herein, the invention provides a method for fabricating a metal-insulator-metal (MIM) capacitor. First, a first metal layer is formed on a substrate. A first plasma treatment is performed on the surface of the first metal layer. Then, a first oxide layer, a nitride layer, a second oxide layer and a second metal layer are sequentially formed over the first metal layer. Thereafter, the second metal layer, the second oxide layer, the nitride layer, the first oxide layer and the first metal layer are defined to form the metal-insulator-metal (MIM) capacitor.

According to one embodiment of the present invention, the reactive gas used in the first plasma treatment includes an inert gas, nitrogen or an oxygen-containing gas, for example. The oxygen-containing gas includes oxygen or nitrous oxide, for example. In one embodiment, if the reactive gas used in the first plasma treatment is an oxygen-containing gas, a third oxide layer is formed on the first metal layer after performing the first plasma treatment.

According to one embodiment of the present invention, the first plasma treatment can be carried out in-situ. In another embodiment, the first plasma treatment can be carried out ex-situ.

According to one embodiment of the present invention, after forming the nitride layer but before forming the second oxide layer, the method further includes performing a second plasma treatment on the surface of the nitride layer. The reactive gas used in the second plasma treatment includes an oxygen-containing gas, for example. The oxygen-containing gas is oxygen or nitrous oxide, for example. Furthermore, after performing the second plasma treatment, a third oxide layer is formed over the nitride layer. In addition, the second plasma treatment can be carried out in situ. In another embodiment, the second plasma treatment can be carried out in ex-situ.

According to one embodiment of the present invention, the first metal layer and the second metal layer are made of aluminum, copper, palladium, ruthenium, titanium nitride or tantalum nitride, for example.

According to one embodiment of the present invention, the first metal layer and the second metal layer are formed, for example, by performing a direct current (DC) magnetic-sputtering process, a chemical vapor deposition (CVD) process or an evaporation process.

According to one embodiment of the present invention, the second oxide layer, the nitride layer and the first oxide layer are formed by performing a chemical vapor deposition process, for example.

The present invention also provides an alternative method for fabricating a metal-insulator-metal (MIM) capacitor. First, a first metal layer is formed on a substrate. Then, a first oxide layer and a nitride layer are sequentially formed over the first metal layer. Thereafter, a plasma treatment is performed on the surface of the nitride layer. Afterwards, a second oxide layer and a second metal layer are sequentially formed over the nitride layer. Thereafter, the second metal layer, the second oxide layer, the nitride layer, the first oxide layer and the first metal layer are defined to form the metal-insulator-metal (MIM) capacitor.

According to one embodiment of the present invention, after performing the plasma treatment, the method further includes forming a third oxide layer on the surface of the nitride layer.

According to one embodiment of the present invention, the reactive gas used in the plasma treatment includes an oxygen-containing gas, for example. The oxygen-containing gas includes oxygen or nitrous oxide, for example.

According to one embodiment of the present invention, the plasma treatment can be carried out in situ, for example. In another embodiment, the plasma treatment can be carried out in ex-situ.

According to one embodiment of the present invention, the first metal layer and the second metal layer can be made of aluminum, copper, palladium, ruthenium, titanium nitride or tantalum nitride, for example.

According to one embodiment of the present invention, the first metal layer and the second metal layer are formed, for example, by performing a DC magnetic-sputtering process, a chemical vapor deposition process or an evaporation process.

According to one embodiment of the present invention, the second oxide layer, the nitride layer and the first oxide layer are formed by performing a chemical vapor deposition process, for example.

In the present invention, a plasma treatment is performed to the surface of a first metal layer so that the surface of the metal layer is planarized. Thus, the breakdown voltage is increased and the reliability of the capacitor is enhanced, and the prior problem of having a low breakdown voltage in the capacitor is alleviated. Furthermore, the method can also include performing a plasma treatment on the surface of the nitride layer or on the surface of both the first metal layer and the nitride layer, for increasing the breakdown voltage and improving the reliability of the capacitor.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 1A:
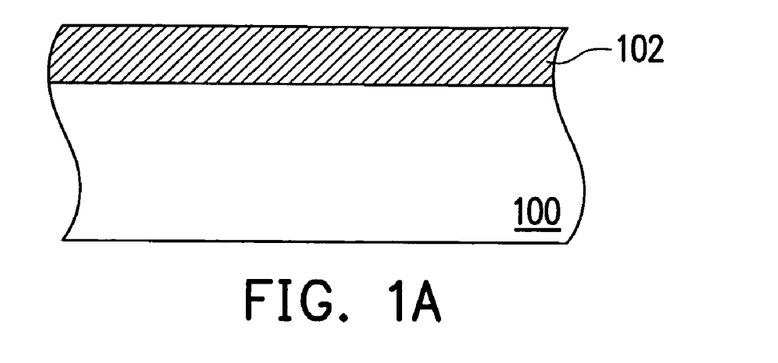
FIGS. 1A through 1G are schematic cross-sectional views showing the steps for fabricating a metal-insulator-metal capacitor according to one embodiment of the present invention.

FIGS. 1A through 1G are schematic cross-sectional views showing the steps for fabricating a metal-insulator-metal capacitor according to one embodiment of the present invention. As shown in FIG. 1A, a substrate 100 is provided. The substrate 100 is a silicon substrate or a substrate having semiconductor devices or metallic interconnect structures already formed thereon, for example. Then, a metal layer 102 is formed over the substrate 100 to serve as the bottom electrode of a metal-insulator-metal (MIM) capacitor. The metal layer 102 is fabricated using aluminum, copper, palladium, ruthenium, titanium nitride or tantalum nitride, for example. The method of forming the metal layer 102 includes, for example, performing a DC magnetic-sputtering process, a chemical vapor deposition process or an evaporation process.

Figure 1B:
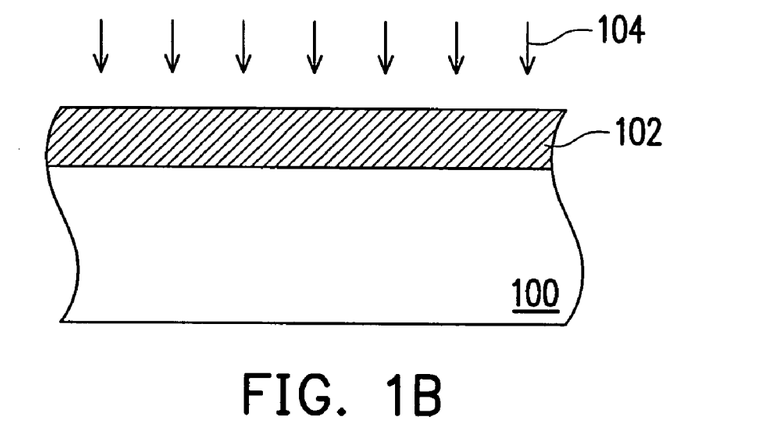

As shown in FIG. 1B, a plasma treatment 104 is performed on the surface of the metal layer 102. The plasma treatment 104 can be carried out in situ, for example. In other words, the process of fabricating the metal layer 102 and the plasma treatment on the surface of the metal layer 102 can be carried out in the same reaction chamber or the same processing machine. Alternatively, the plasma treatment 104 can be carried out in ex-situ. Furthermore, the reactive gas used in the plasma treatment 104 includes an inert gas, nitrogen or an oxygen-containing gas, for example. The oxygen-containing gas includes oxygen or nitrous oxide, for example.

Figure 1C:
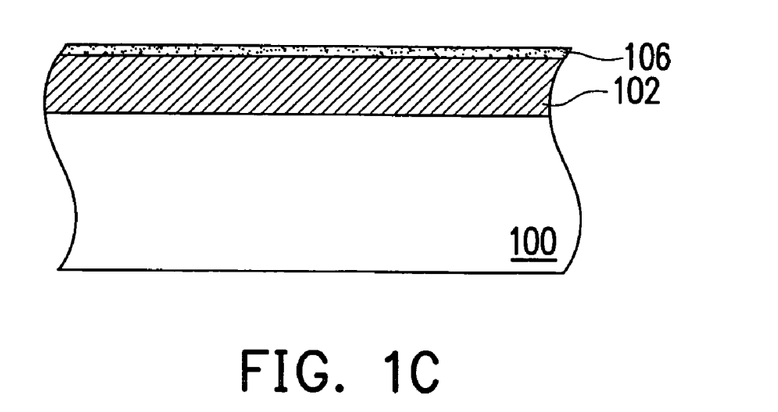

It should be noted that the plasma treatment 104 can planarize the surface of the metal layer 102 and prevent the prior low breakdown voltage problem in the conventional capacitor when inert gas or nitrogen is used as a reactive gas in the plasma treatment 104. Hence, both the breakdown voltage and the reliability of the capacitor are increased. On the other hand, if an oxygen-containing gas is used as a reactive gas in the plasma treatment 104, an oxide layer 106 is formed on the metal layer 102 as shown in FIG. 1C. Similarly, both the breakdown voltage and the reliability of the capacitor are increased.

Figure 1D:
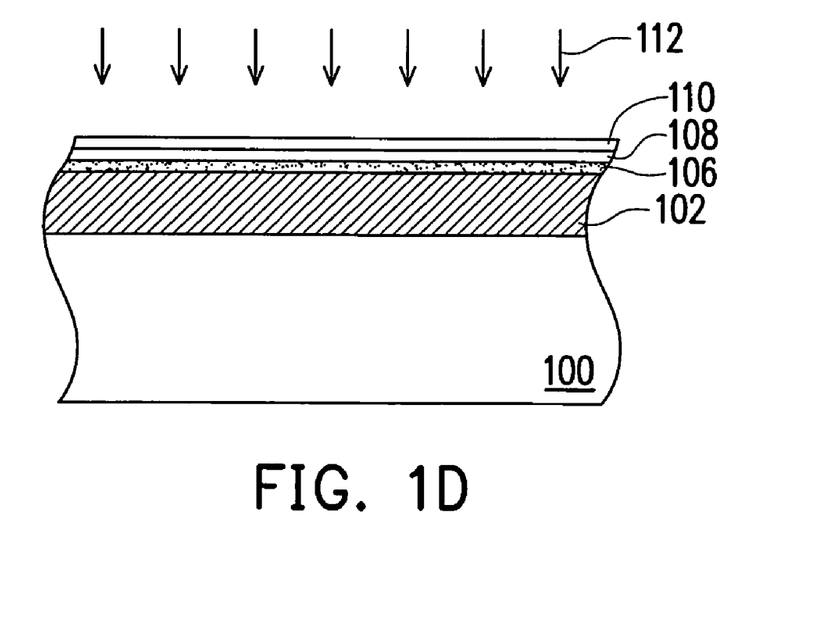

As shown in FIG. 1D, an oxide layer 108 is formed over the oxide layer 106. The oxide layer 108 is a silicon oxide layer formed, for example, by performing a chemical vapor deposition process. The chemical vapor deposition process includes a plasma-enhanced chemical vapor deposition (PECVD) process, for example. Thereafter, a nitride layer 110 is formed over the oxide layer 108. The nitride layer 110 is a silicon nitride layer formed, for example, by performing a chemical vapor deposition process. The chemical vapor deposition process includes a plasma-enhanced chemical vapor deposition (PECVD) process, for example.

Figure 1E:
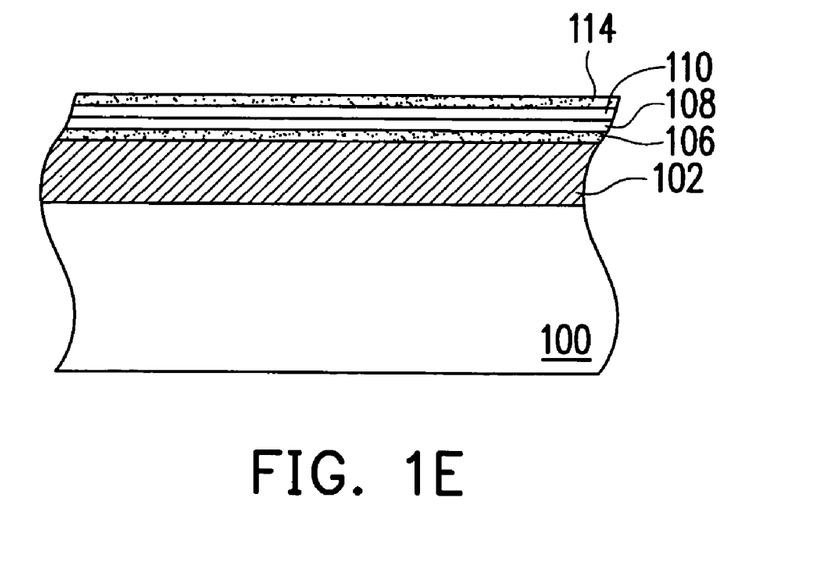

In one embodiment of the present invention, after forming the nitride layer 110 but before forming the oxide layer, a plasma treatment 112 can be carried out on the surface of the nitride layer 110. The plasma treatment is performed using a reactive gas such as an oxygen-containing gas. The oxygen-containing gas is oxygen or nitrous oxide, for example. The foregoing plasma treatment process 112 will form an oxide layer 114 over the nitride layer 110 as shown in FIG. 1E. Similarly, the plasma treatment 112 can increase the breakdown voltage and improve the reliability of the capacitor. Furthermore, the plasma treatment 112 can be carried out in-situ, for example. However, the plasma treatment 112 can be carried out in ex-situ.

Figure 1F:
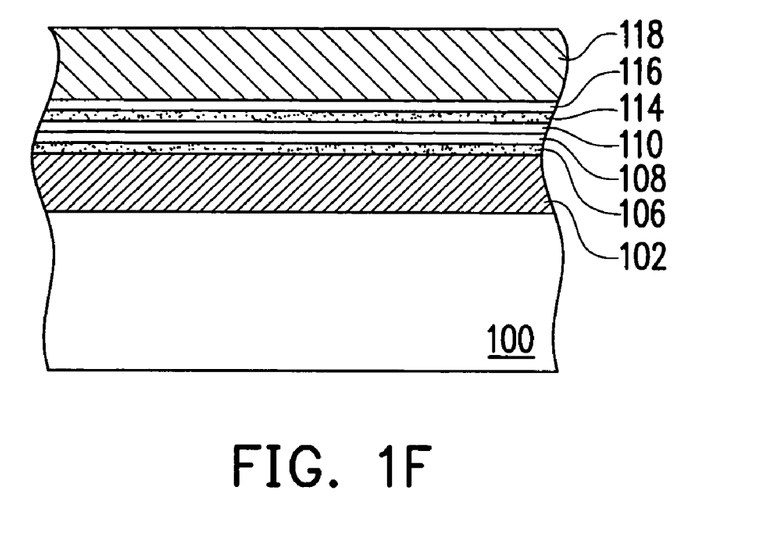

As show in FIG. 1F, another oxide layer 116 is formed over the oxide layer 114. The oxide layer 116 is a silicon oxide layer formed, for example, by performing a chemical vapor deposition process. The chemical vapor deposition process includes a plasma-enhanced chemical vapor deposition (PECVD) process, for example. Then, a metal layer 118 is formed over the oxide layer 116 to serve as the top electrode of the metal-insulator-metal capacitor. The metal layer 118 is fabricated using aluminum, copper, palladium, ruthenium, titanium nitride or tantalum nitride, for example. The method of forming the metal layer 118 includes, for example, performing a DC magnetic-sputtering process, a chemical vapor deposition process or an evaporation process.

Figure 1G:
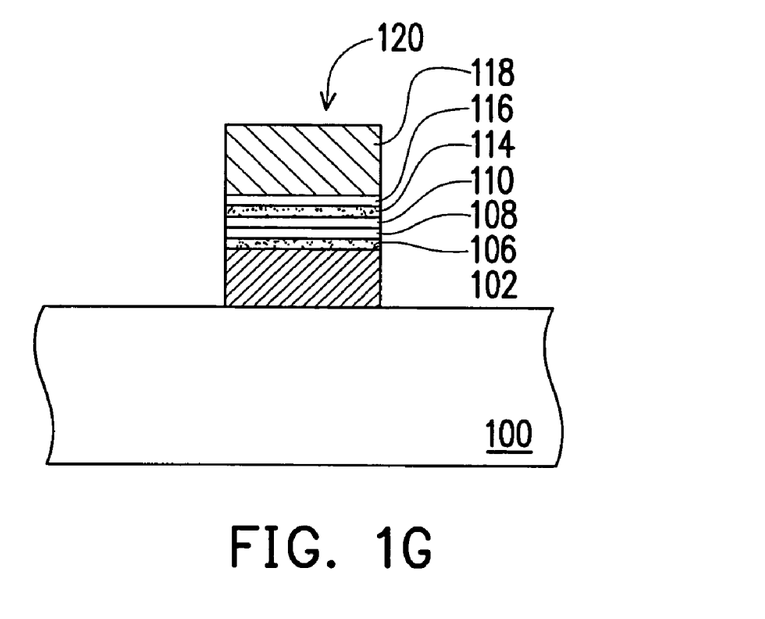

As shown in FIG. 1G, the metal layer 118, the oxide layer 116, the oxide layer 114, the nitride layer 110, the oxide layer 108, the oxide layer 106 are defined to form a metal-insulator-metal (MIM) capacitor 120. The process of defining the foregoing layers includes performing a photolithographic and etching process, for example.

Figure 2A:
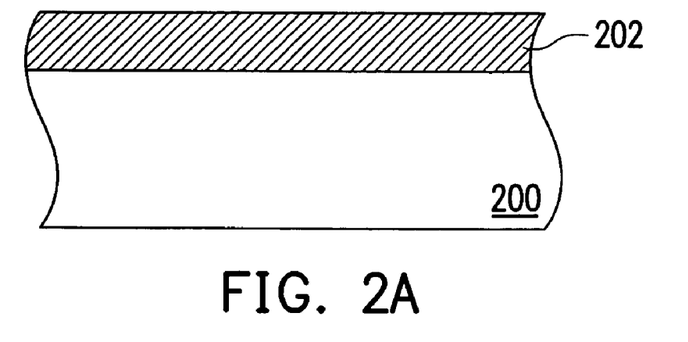
FIGS. 2A through 2E are schematic cross-sectional views showing the steps for fabricating a metal-insulator-metal capacitor according to another embodiment of the present invention.

FIGS. 2A through 2E are schematic cross-sectional views showing the steps for fabricating a metal-insulator-metal capacitor according to another embodiment of the present invention. As shown in FIG. 2A, a substrate 200 is provided. Then, a metal layer 202 is formed over the substrate 200 to serve as the bottom electrode of a metal-insulator-metal (MIM) capacitor. The metal layer 202 is fabricated using aluminum, copper, palladium, ruthenium, titanium nitride or tantalum nitride, for example. The method of forming the metal layer 202 includes, for example, performing a DC magnetic-sputtering process, a chemical vapor deposition process or an evaporation process.

Then, an oxide layer 204 is formed over the metal layer 202. The oxide layer 204 can be a silicon oxide layer formed, for example, by performing a chemical vapor deposition process. The chemical vapor deposition process includes a plasma-enhanced chemical vapor deposition (PECVD) process, for example. Thereafter, a nitride layer 206 is formed over the oxide layer 204. The nitride layer 206 can be a silicon nitride layer formed, for example, by performing a chemical vapor deposition process. Similarly, the chemical vapor deposition process includes a plasma-enhanced chemical vapor deposition (PECVD) process, for example.

Figure 2B:
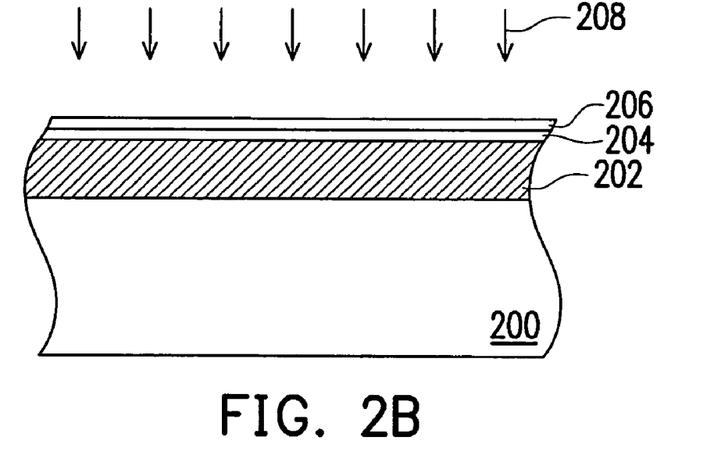
Figure 2C:
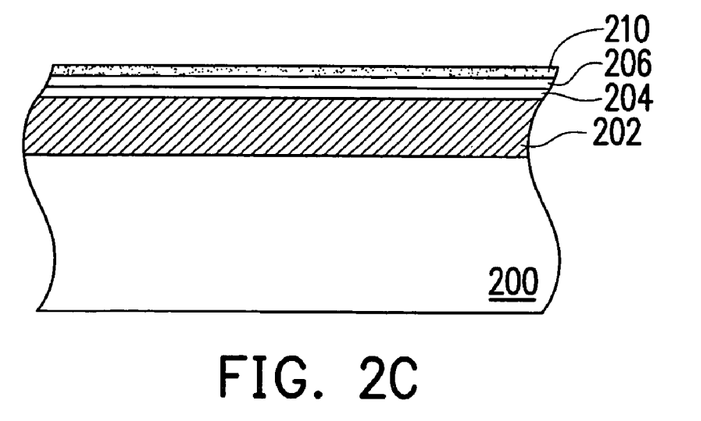

As shown in FIG. 2B, a plasma treatment 208 is performed on the surface of the nitride layer 206. The reactive gas used in plasma treatment 208 includes an oxygen-containing gas. The oxygen-containing gas is oxygen or nitrous oxide, for example. Furthermore, the plasma treatment process 112 can be carried out in situ or ex-situ, for example. More specifically, the plasma treatment 208 forms an oxide layer 210 on the nitride layer 206 as shown in FIG. 2C. The oxide layer 210 serves to increase the breakdown voltage and improve the reliability of the capacitor.

Figure 2D:
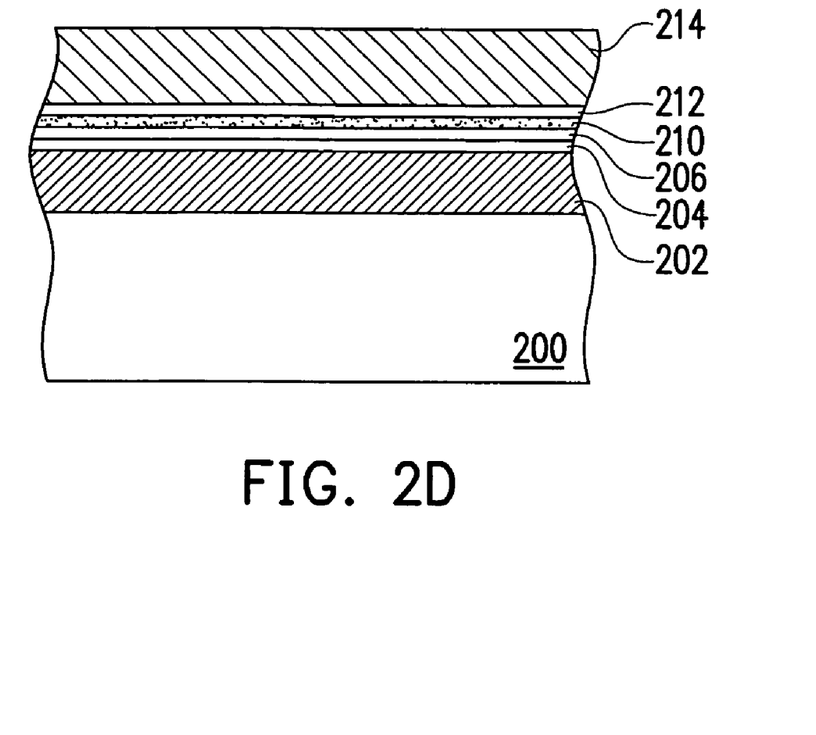

As shown in FIG. 2D, another oxide layer 212 is formed over the oxide layer 210. The oxide layer 212 can be a silicon oxide layer formed, for example, by performing a chemical vapor deposition process. The chemical vapor deposition process includes a plasma-enhanced chemical vapor deposition (PECVD) process, for example. Then, a metal layer 214 is formed on the oxide layer 212 to serve as the top electrode of the metal-insulator-metal (MIM) capacitor. The metal layer 214 is fabricated using aluminum, copper, palladium, ruthenium, titanium nitride or tantalum nitride, for example. The method of forming the metal layer 214 includes, for example, performing a DC magnetic-sputtering process, a chemical vapor deposition process or an evaporation process.

Figure 2E:
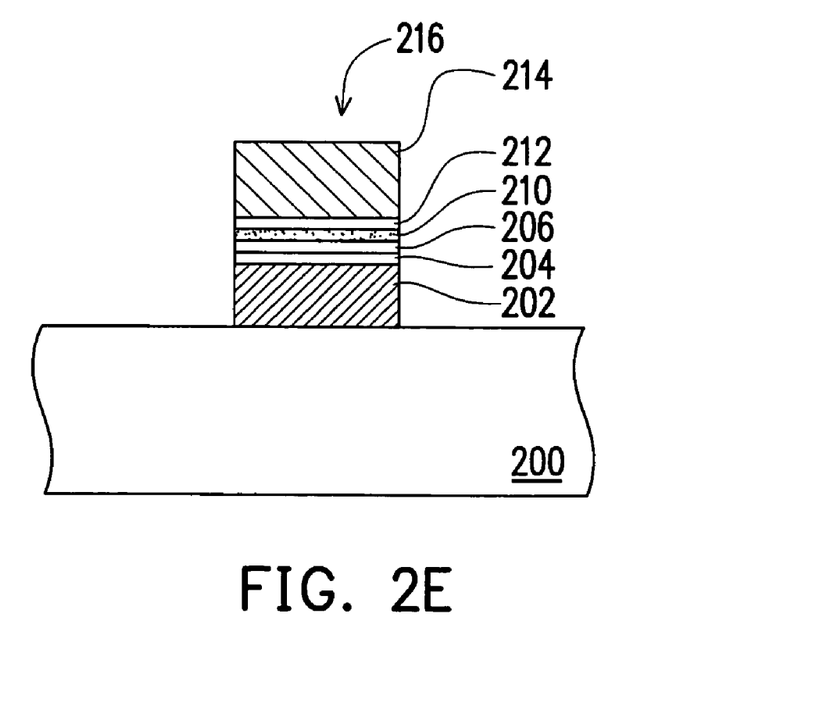

As shown in FIG. 2E, the metal layer 214, the oxide layer 212, the oxide layer 210, the nitride layer 206, the oxide layer 204 and the metal layer 202 are defined to form the metal-insulator-metal capacitor 216. The method of defining the foregoing layers includes performing a photolithographic and etching process, for example.

Figure 3:
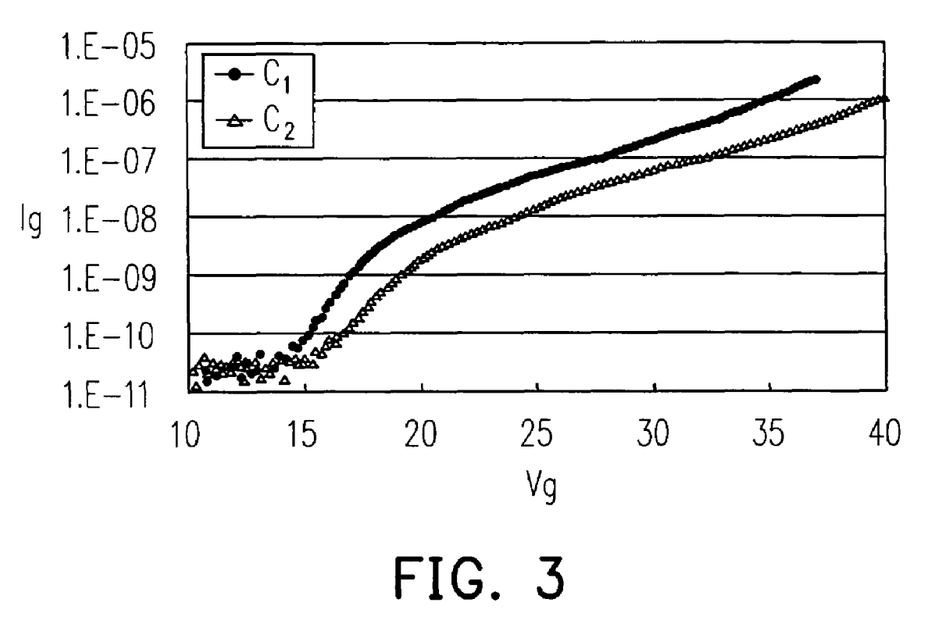
FIG. 3 is a graph showing the relationships of the leakage current versus the voltage for a metal-insulator-metal capacitor fabricated by the conventional method and by the method according to the present invention.

FIG. 3 is a graph showing the relationships of the leakage current versus voltage (I-V) characteristic between a MIM capacitor fabricated by the conventional method and a MIM capacitor fabricated by the method according to the present invention. As shown in FIG. 3, the Y-axis represents the leakage current (Ig) and the X-axis represents the DC voltage Vg acting on the metal layer. The curve C1 shows the I-V characteristic of a conventional metal-insulator-metal capacitor and the curve C2 shows the I-V characteristic of the metal-insulator-metal capacitor fabricated according to the method in the present invention. As shown in FIG. 3, under a constant operating voltage, the MIM capacitor fabricated according to the present invention has a smaller leakage current compared to the conventional MIM capacitor. In other words, the MIM capacitor fabricated using the method according to the present invention has a higher breakdown voltage and a higher degree of reliability.

In summary, the plasma treatment process performed to the metal layer and/or the nitride layer according to the method in the present invention can produce an oxide layer thereon or planarize the surface of the metal layer. Therefore, the problem of having a lower breakdown voltage in the conventional capacitor can be alleviated. Ultimately, the capacitor can have a higher breakdown voltage and better reliability.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a metal-insulator-metal capacitor, comprising the steps of:
   forming a first metal layer on a substrate;
   performing a first plasma treatment on a surface of the first metal layer to form a first oxide layer directly on the first metal layer, wherein a reactive gas used in the first plasma treatment is nitrous oxide;
   forming a second oxide layer over the first oxide layer;
   forming a nitride layer over the second oxide layer;
   performing a second plasma treatment process on the surface of the nitride layer to form a third oxide layer over the nitride layer;
   performing a deposition process to form a fourth oxide layer over the third oxide layer;
   forming a second metal layer over the fourth oxide layer; and
   defining the second metal layer, the fourth oxide layer, the third oxide layer, the nitride layer, the second oxide layer and the first metal layer to form the metal-insulator-metal capacitor.

2. The method of fabricating the metal-insulator-metal capacitor of claim 1, wherein the first plasma treatment is performed in-situ.

3. The method of fabricating the metal-insulator-metal capacitor of claim 1, wherein the first plasma treatment is performed ex-situ.

4. The method of fabricating the metal-insulator-metal capacitor of claim 1, wherein a reactive gas for the second plasma treatment includes an oxygen-containing gas.

5. The method of fabricating the metal-insulator-metal capacitor of claim 4, wherein the oxygen-containing gas includes oxygen or nitrous oxide.

6. The method of fabricating the metal-insulator-metal capacitor of claim 1, wherein the second plasma process is performed in-situ.

7. The method of fabricating the metal-insulator-metal capacitor of claim 1, wherein the second plasma process is performed ex-situ.

8. The method of fabricating the metal-insulator-metal capacitor of claim 1, wherein the first metal layer and the second metal layer are made of aluminum, copper, palladium, ruthenium, titanium nitride or tantalum nitride.

9. The method of fabricating the metal-insulator-metal capacitor of claim 1, wherein the step of forming the first metal layer and the second metal layer includes performing a DC magnetic-sputtering process, a chemical vapor deposition process or an evaporation process.

10. The method of fabricating the metal-insulator-metal capacitor of claim 1, wherein the step for forming the fourth oxide layer, the nitride layer and the second oxide layer includes performing a chemical vapor deposition process.

11. A method for fabricating a metal-insulator-metal capacitor, comprising the steps of:

forming a first metal layer on a substrate;

performing a first plasma treatment on a surface of the first metal layer to form a first oxide layer directly on the first metal layer, wherein a reactive gas used in the first plasma treatment is an oxygen-containing gas;

forming a second oxide layer over the first oxide layer;

forming a nitride layer over the second oxide layer before performing a second plasma treatment process;

performing the second plasma treatment process on the surface of the nitride layer to form a third oxide layer over the nitride layer after forming the nitride layer;

forming a fourth oxide layer over the third oxide layer after performing the second plasma treatment process;

forming a second metal layer over the fourth oxide layer; and defining the second metal layer, the fourth oxide layer, the third oxide layer, the nitride layer, the second oxide layer and the first metal layer to form the metal-insulator-metal capacitor.

12. The method of fabricating the metal-insulator-metal capacitor of claim 11, wherein the oxygen-containing gas includes oxygen or nitrous oxide.

13. The method of fabricating the metal-insulator-metal capacitor of claim 11, wherein a reactive gas for the second plasma treatment includes an oxygen-containing gas.

14. The method of fabricating the metal-insulator-metal capacitor of claim 13, wherein the oxygen-containing gas includes oxygen or nitrous oxide.

* * * * *